United States Patent
Nakamura et al.

(10) Patent No.: US 9,437,535 B2
(45) Date of Patent: Sep. 6, 2016

(54) WIRELESS MODULE AND PRODUCTION METHOD FOR WIRELESS MODULE

(71) Applicant: PANASONIC CORPORATION, Osaka (JP)

(72) Inventors: Maki Nakamura, Kanagawa (JP); Suguru Fujita, Tokyo (JP)

(73) Assignee: PANASONIC INTELLECTUAL PROPERTY MANAGEMENT CO., LTD., Osaka (JP)

(*) Notice: Subject to any disclaimer, the term of this patent is extended or adjusted under 35 U.S.C. 154(b) by 0 days.

(21) Appl. No.: 14/388,349

(22) PCT Filed: Jan. 29, 2014

(86) PCT No.: PCT/JP2014/000464
§ 371 (c)(1),
(2) Date: Sep. 26, 2014

(87) PCT Pub. No.: WO2014/119302
PCT Pub. Date: Aug. 7, 2014

(65) Prior Publication Data
US 2015/0332997 A1 Nov. 19, 2015

(30) Foreign Application Priority Data
Jan. 29, 2013 (JP) ................................ 2013-014606

(51) Int. Cl.
*H01L 23/495* (2006.01)
*H01L 23/498* (2006.01)
*H01L 23/31* (2006.01)
(Continued)

(52) U.S. Cl.
CPC ..... *H01L 23/49838* (2013.01); *H01L 21/4853* (2013.01); *H01L 21/56* (2013.01); *H01L 21/565* (2013.01); *H01L 23/3121* (2013.01);
(Continued)

(58) Field of Classification Search
CPC ................................................ H01L 23/49838
See application file for complete search history.

(56) References Cited

U.S. PATENT DOCUMENTS

| 2007/0182012 A1* | 8/2007 | DeRaedt | H01L 23/3128 257/738 |
| 2009/0168367 A1 | 7/2009 | Fujii | |

(Continued)

FOREIGN PATENT DOCUMENTS

| JP | 2001-119138 A | 4/2001 |
| JP | 2002-359345 A | 12/2002 |

(Continued)

OTHER PUBLICATIONS

International Search Report for Application No. PCT/JP2014/000464 dated Apr. 28, 2014.

*Primary Examiner* — Charles Garber
*Assistant Examiner* — Brigitte Paterson
(74) *Attorney, Agent, or Firm* — Pearne & Gordon LLP (57) ABSTRACT

Provided is a wireless module whose size can be made smaller. The wireless module includes: a first substrate on which an antenna is mounted; a second substrate which opposes the first substrate and on which an electronic component is mounted; and a plurality of electric conductors which connect the first substrate and the second substrate and which transmit a signal between the antenna and the electronic components, wherein the plurality of electric conductors are disposed between the first substrate and the second substrate in series in a substantially vertical direction with respect to mounting surfaces of the first substrate and the second substrate.

10 Claims, 8 Drawing Sheets

(51) Int. Cl.
*H01L 21/56* (2006.01)
*H01L 21/48* (2006.01)
*H01L 23/66* (2006.01)
*H05K 3/36* (2006.01)
*H05K 1/14* (2006.01)
*H05K 1/18* (2006.01)
*H05K 3/46* (2006.01)

(52) U.S. Cl.
CPC ... *H01L23/49811* (2013.01); *H01L 23/49833* (2013.01); *H01L 23/66* (2013.01); *H05K 3/368* (2013.01); *H01L 2223/6677* (2013.01); *H01L 2224/16225* (2013.01); *H01L 2224/32225* (2013.01); *H01L 2224/73253* (2013.01); *H01L 2924/1533* (2013.01); *H01L 2924/15192* (2013.01); *H01L 2924/18161* (2013.01); *H05K 1/144* (2013.01); *H05K 1/186* (2013.01); *H05K 3/4614* (2013.01); *H05K 2201/0379* (2013.01); *H05K 2201/042* (2013.01); *H05K 2201/10098* (2013.01); *H05K 2201/10234* (2013.01); *H05K 2203/061* (2013.01)

(56) References Cited

U.S. PATENT DOCUMENTS

| | | |
|---|---|---|
| 2009/0243065 A1 | 10/2009 | Sugino et al. |
| 2009/0267221 A1 | 10/2009 | Fujii |
| 2011/0128713 A1* | 6/2011 | Kawano ............... H01L 23/66 |
| | | 361/784 |
| 2014/0116765 A1* | 5/2014 | Hossain ............... H05K 3/42 |
| | | 174/260 |

FOREIGN PATENT DOCUMENTS

| | | |
|---|---|---|
| JP | 2003-197820 A | 7/2003 |
| JP | 2004-356138 A | 12/2004 |
| JP | 2006-140178 A | 6/2006 |
| JP | 2007-173570 A | 7/2007 |
| JP | 2009-158742 A | 7/2009 |
| JP | 2009-266979 A | 11/2009 |
| JP | 2010-199612 A | 9/2010 |
| JP | 2012-015909 A | 1/2012 |

* cited by examiner

WIRELESS MODULE AND PRODUCTION METHOD FOR WIRELESS MODULE

TECHNICAL FIELD

The present disclosure relates to a wireless module and a production method for wireless module.

BACKGROUND ART

In related art, there is a wireless module in which radio frequency (RF) signals are transmitted between a semiconductor chip mounted on a multilayer substrate and an antenna through, for example, via holes.

As a conventional wireless module, there is known a wireless module in which in the case where a plurality of substrates on which semiconductor chips (ICs: integrated circuits) are respectively mounted are laminated and connected, balls serving as electric conductors are superposed in two stages (for example, refer to Patent Document 1). With this configuration, the areas of the electrodes are made small and multiple pinning is attained.

RELATED ART DOCUMENTS

Patent Documents

Patent Document 1: JP-A-2004-356138

SUMMARY OF THE INVENTION

Problem to be Solved by the Invention

In the conventional wireless module, reduction of the size of the module was insufficient.

In consideration of the above-mentioned circumstances, the present disclosure provides a wireless module whose size can be made smaller and a production method for a wireless module.

Means for Solving the Problem

A wireless module of the present disclosure includes: a first substrate on which an antenna is mounted; a second substrate which opposes the first substrate and on which an electronic component is mounted; and a plurality of electric conductors which connect the first substrate and the second substrate and which transmit a signal between the antenna and the electronic component, wherein the plurality of electric conductors are disposed between the first substrate and the second substrate in series in a substantially vertical direction with respect to mounting surfaces of the first substrate and the second substrate.

Advantages of the Invention

According to the present disclosure, it is possible to reduce the size of the module.

MODE FOR CARRYING OUT THE INVENTION

Embodiments according to the present disclosure will be described below referring to the drawings.

(Circumstances Leading to an Embodiment According to the Present Disclosure)

In the conventional wireless module, in the case that the space between a first substrate on which an antenna is formed and a second substrate on which a semiconductor chip is mounted is connected with balls, lands are required on the substrates receiving the balls. The size of the land depends on the size of the ball; in the case that the land is made larger, the parasitic capacitance of the land becomes larger.

Furthermore, as the size of the ball becomes larger, the impedance of the passage from the second substrate to the first substrate through the balls, including the balls and lands, becomes lower. Because of these reasons, impedance mismatching between the passage from the second substrate to the first substrate and the passage along the lines on the substrates leading to the lands becomes large. Hence, for impedance matching, the lines through which signals are transmitted are required to be extended or a matching circuit is required to be provided, whereby the size of the module has increased.

Moreover, in Patent Document 1, the number of the balls to be suppressed in two stages increases for multiple pinning, whereby the size of the module has increased. Still further, RF signal transmission through the balls has not been considered, and impedance matching has not been examined.

In each of the following embodiments, a wireless module whose size can be made smaller and a production method for a wireless module will be described.

The wireless module according to each of the embodiments is used for, for example, a wireless communication circuit for millimeter wave band high-frequency signals (for example, 60 GHz) and various electronic components (for example, an antenna and a semiconductor chip) are mounted on the wireless module.

(First Embodiment)

Figure 1:
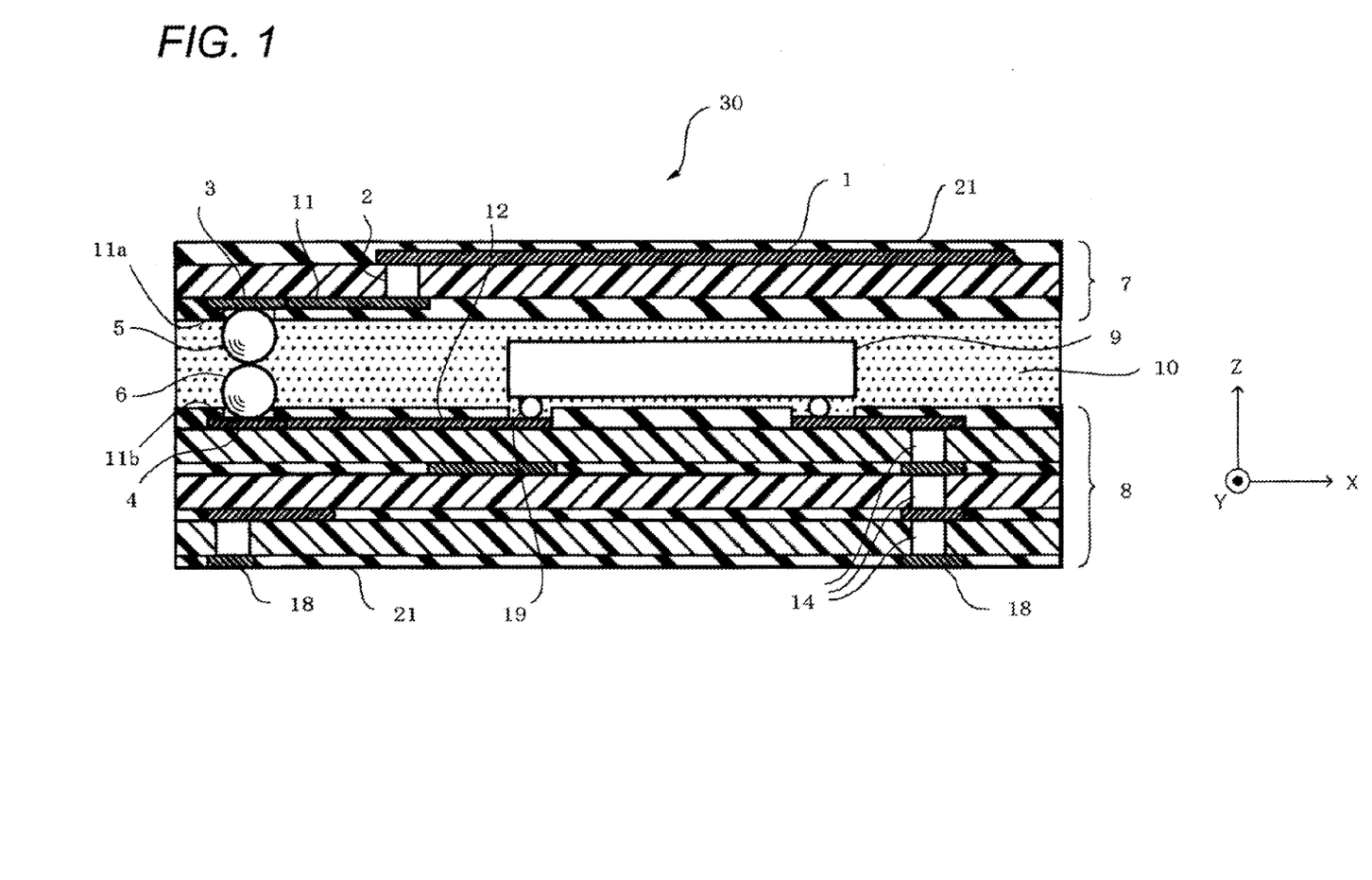
FIG. 1 is a cross-sectional view showing an example of a structure of a wireless module according to a first embodiment.

FIG. 1 is a cross-sectional view showing an example of a structure of a wireless module 30 according to a first embodiment. The wireless module 30 has a first substrate (upper substrate in FIG. 1) 7 and a second substrate (lower substrate) 8. Furthermore, in the wireless module 30, an antenna 1 is formed on the surface of the first substrate 7, and a semiconductor chip (IC) 9 is built in the module. The first substrate 7 and the second substrate may be a multilayer substrate or a single-layer substrate.

In FIG. 1, the first substrate 7 is a two-layer substrate, and the respective layers are connected together through a via hole 2. The antenna 1 is formed on the outer face (on one face, the uppermost layer in FIG. 1) of the first substrate 7. The antenna 1 has a feeding point and is a patch antenna having a rectangular shape, for example. In addition, a wiring pattern 11 connected to the antenna 1 through the via hole 2 and a pad section 3 are formed on the inner face (on the other face, the lowermost layer in FIG. 1) of the first substrate 7. A first ball 5 serving as a first spherical electric conductor having conductivity is connected to the pad section 3. The first substrate 7 may be a multilayer substrate having layers other than two layers.

In FIG. 1, the second substrate 8 is a four-layer substrate, and the respective layers are connected together through via holes 14. A wiring pattern 12 on which the semiconductor chip 9 is mounted by, for example, flip-chip bonding and a pad section 4 opposes the pad section 3 are formed on the inner face (the uppermost layer in FIG. 1) of the second substrate 8. A second ball 6 serving as a second spherical electric conductor having conductivity is connected to the pad section 4. Furthermore, for example, chip capacitors and a crystal oscillator, not shown, are mounted on the second substrate 8. The second substrate 8 may be a multilayer substrate having layers other than two layers.

The signal output terminal of the semiconductor chip 9 is connected to the pad section 4 through the wiring pattern 12. In addition, a molding resin 10 is filled as a molding compound in the space section formed between the first substrate 7 and the second substrate 8 to enhance the strength of the wireless module 30. For example, an epoxy-based resin material is used as the material of the molding resin 10. Furthermore, a connection pad 18 to be connected to a mounting board (for example, a motherboard), not shown, is disposed on the lowermost layer of the second substrate 8.

Moreover, a material other than the material of the second substrate 8 may be used as the material of the first substrate 7 on which the antenna 1 is formed. Communication performance can be improved by using a material suited for communication in the millimeter wave band as the material of the first substrate 7. For example, epoxy-based resin materials are used as the materials of the first substrate 7 and the second substrate 8.

For example, as the material of the first substrate 7, a material having a dielectric constant ($\epsilon$) and a dielectric loss tangent (tan $\delta$) smaller than those of the material of the second substrate 8 may be uses. In this case, the size of the second ball 6 to be mounted on the second substrate 8 can be made small, and the size of the pad section 4 can be made small. Hence, the electrical loss of a signal to be transmitted can be reduced. Furthermore, production can be made at a lower cost than that in the case that both the first substrate 7 and the second substrate 8 are made of materials having small dielectric loss tangents.

In FIG. 1, between the pad section 3 and the pad section 4, the first ball 5 and the second ball 6 being substantially equal, for example, in diameter are connected together so as to be superposed in two stages. In other words, the first ball 5 and the second ball 6 are connected in series so as to be superposed in two stages so that the center of the first ball 5 is aligned with the center of the second ball 6 in the vertical direction (in the Z-direction).

Since the diameter of the first ball 5 and the diameter of the second ball 6 are made substantially equal to each other, the areas of the pad sections 3 and 4 formed on the inner faces of the first substrate 7 and the second substrate 8 can be made small. Furthermore, an RF signal (for example, a high-frequency signal) is transmitted between the antenna 1 and the semiconductor chip 9 through the first ball 5 and the second ball 6.

At least the surfaces of the first ball 5 and the second ball 6 are covered with solder. For example, each of the first ball 5 and the second ball 6 has a core section made of copper (Cu) inside the ball, and the core section is covered with solder.

In this embodiment, the first ball 5 is, for example, a solder ball having no core section, and the second ball 6 is, for example, a ball having a core section. Since a solder ball having a core section is used as the second ball 6, the amount of solder is reduced, and the amount of solder to be re-melted in the case that the first substrate 7 is mounted on the second substrate 8 can be reduced. Furthermore, since a solder ball having no core section is used as the first ball 5, a self-alignment effect in which even if the ball causes a slight positional displacement when melted, the ball returns to the position where the solder is located, is improved, whereby positional adjustment can be made easy. Hence, the yield of mounting can be improved.

Moreover, the core sections of the first ball 5 and the second ball 6 may be made of materials being different from each other. For example, the core section of the first ball 5 may be made of copper, and the core section of the second ball 6 may be made of aluminum.

What's more, the first ball 5 is connected to the pad section 3 and the second ball 6 is connected to the pad section 4 by heating the balls and by melding the solder. Hence, a positive correlation is obtained between the size of the pad section 3 and the size of the first ball 5, and a positive correlation is obtained between the size of the pad section 4 and the size of the second ball 6.

Herein, as a configuration for the connection between the first substrate 7 and the second substrate 8, a configuration in which a ball is used in a single stage is compared with a configuration in which balls are used in two or more stages; in the case that the height (the length in the Z-direction) between the first substrate 7 and the height of the second substrate 8 is the same, the sizes of the balls can be made smaller in the configuration in which the balls are used in two stages.

In other words, the sizes of the pad sections can be made small, the parasitic capacitances of the pad sections become small, and the high-frequency characteristics are improved. Furthermore, in each substrate, the pad section can be disposed in a smaller area, and the size of the substrate can be made small.

Moreover, for example, a resist 21 is applied to both faces (the uppermost layer or the lowermost layer) of the respective substrates to be laminated as the first substrate 7 and the second substrate 8 at portions except those required to be exposed for component mounting, for example. At the pad section 3 and the pad section 4, lands 11a and 11b serving as the end sections of the wiring patterns 11 and 12 are exposed from the resist 21. Hence, the pad section 3 can be connected to the first ball 5 easily, and the pad section 4 can be connected to the second ball 6 easily.

The first substrate 7 and the second substrate 8 are laminated while the first ball 5 and the second ball 6 connected to each other on the inner sides of the respective substrates are aligned in position and superposed with each other, and then the molding resin 10 is filled entirely, whereby the molding resin 10 is formed as a single layer and the wireless module 30 is produced.

Since the antenna 1 is formed on the uppermost layer of the first substrate 7 in the wireless module 30, the location of the antenna 1 can be secured easily. In addition, since no semiconductor chip is mounted on the first substrate 7, numerous balls for signal transmission are not required to be prepared between the first substrate 7 and the second substrate 8, and the number of the balls to be superposed in two stages can be suppressed.

Furthermore, since the balls superposed in two stages are used, the sizes of the respective balls can be made small, and the sizes of the pad sections 3 and 4 can also be made small, whereby the parasitic capacitances of the pads are made small and the impedance of the passage through the balls can be suppressed from lowering. As a result, the dependency on the adjustment of the impedance by the adjustment of the lengths of the wiring patterns 11 and 12 to be connected to the pad sections 3 and 4 can be reduced, whereby the impedance can be matched easily.

Since the number of the balls to be superposed in two stages is decreased and the pad sections are made small as described above, the size of the substrates can be made small.

Still further, since the molding resin 10 is filled in the space between the first substrate 7 and the second substrate 8, the connection between the first ball 5 and the second ball 6 can be made strong. In particular, even in the case that the number of the balls to be mounted is small, the strength can be secured.

(Second Embodiment)

In the first embodiment, a case in which one layer of molding resin is used has been described; however, in a second embodiment, a case in which two layers of molding resin are used will be described.

In a wireless module according to the second embodiment, the same components as those according to the first embodiment are designated by the same reference numerals and signs, and their descriptions are omitted.

Figure 2:
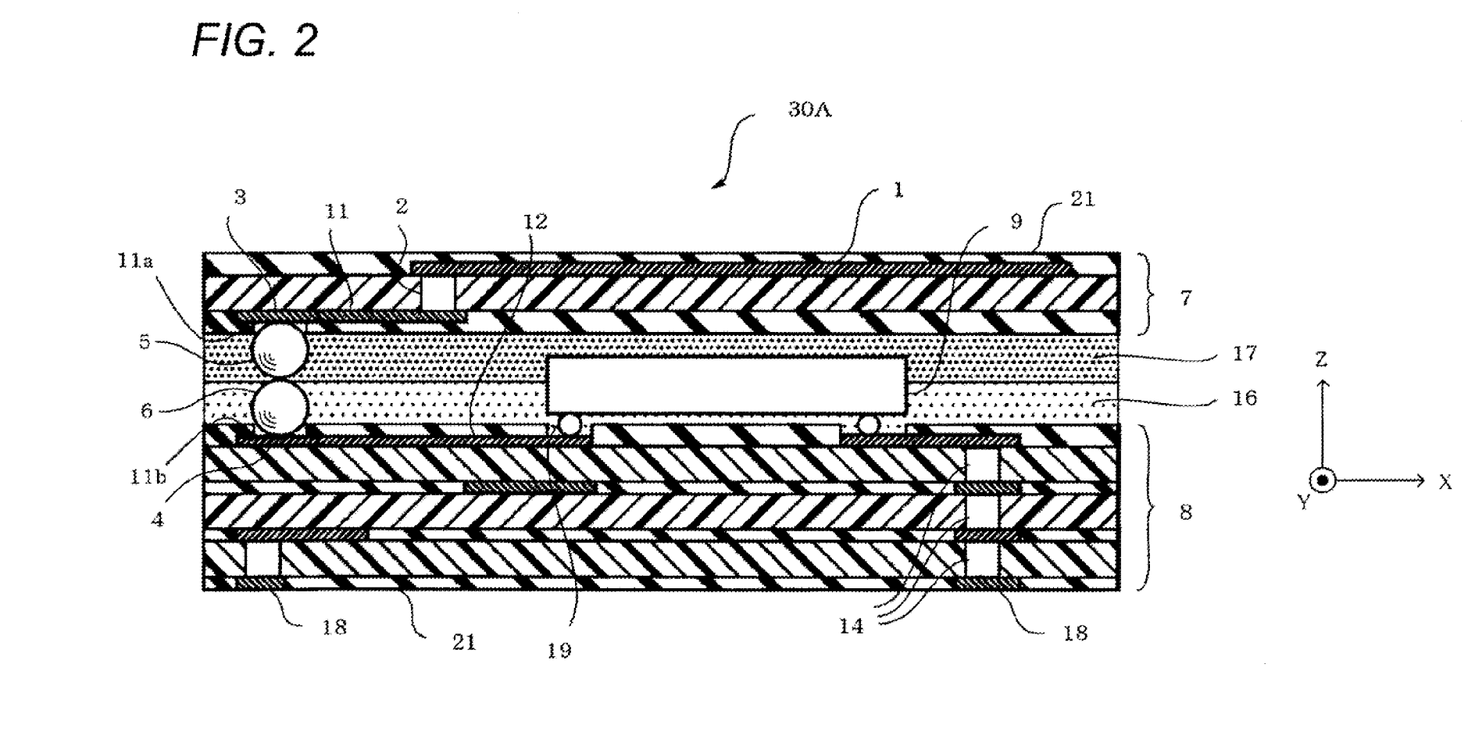
FIG. 2 is a cross-sectional view showing an example of a structure of a wireless module according to a second embodiment.

FIG. 2 is a cross-sectional view showing an example of a structure of a wireless module 30A according to the second embodiment. In the wireless module 30A, a first molding resin 16 is filled in the space from the uppermost layer of the second substrate 8 to the height h of the first ball 5 or to a height slightly lower than the height h of the first ball 5. The height of the first molding resin 16 may merely be set so that the first ball 5 and the second ball 6 can be connected together. Furthermore, a second molding resin 17 is filled to bury the remaining space other than the space filled with the first molding resin 16 between the second substrate 8 and the first substrate 7.

The first molding resin 16 is an example of a first layer of molding compound, and the second molding resin 17 is an example of a second layer of molding compound. The height of the ball is the length of the ball in the thickness direction (the Z-direction in FIG. 2) of the substrate or the molding resin.

Next, processing for producing the wireless module 30A will be described.

FIGS. 3(A) to 3(G) are views showing an example of processing for producing the wireless module 30A.

First, the second substrate 8 is prepared. The wiring pattern 12 and the pad section 4 are formed on the upper face of the second substrate 8 (see FIG. 3(A)), and the semiconductor chip 9 is, for example, flip-chip mounted on bumps 19 located on the wiring pattern 12 (see FIG. 3(B)). In addition, the second ball 6 is mounted on the wiring pattern 12.

Figure 3A:
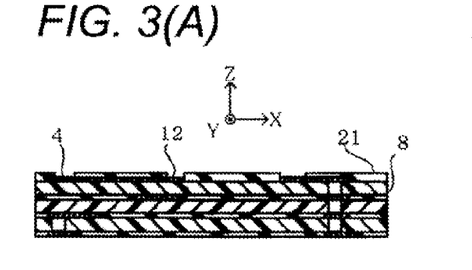
FIGS. 3(A) to 3(G) are views showing an example of processing for producing the wireless module according to the second embodiment.
Figure 3B:
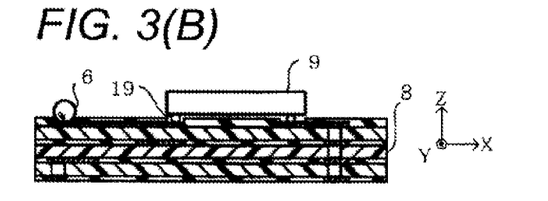
Figure 3C:
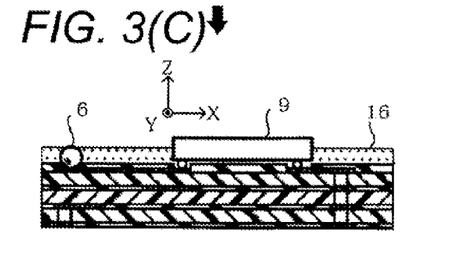
Figure 3D:
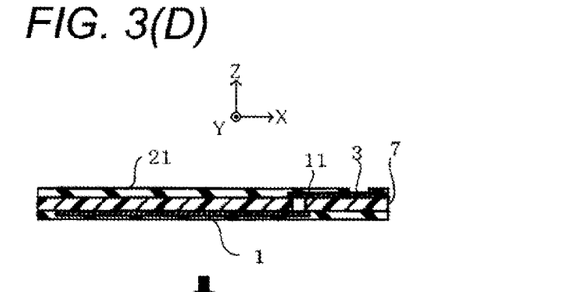
Figure 3E:
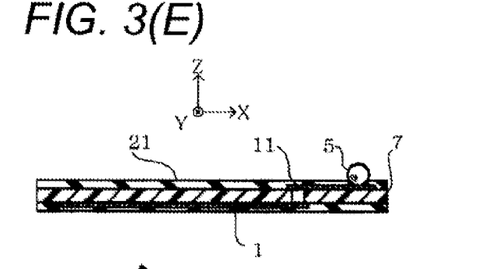

Then, on the side of the second substrate 8, the first molding resin 16 serving as the first layer is filled to the height h of the second ball 6 or to a height lower than the height h of the second ball 6 (see FIG. 3(C)). In other words, the first molding resin 16 is filled to the height h of the second ball 6 or less and to a height such that the second ball 6 is exposed.

On the other hand, the first substrate 7 is prepared. The antenna 1 is formed on the lower face of the first substrate 7, and the wiring pattern 11 and the pad section 3 are formed on the upper face of the first substrate 7 (see FIG. 3(D)). Furthermore, the first ball 5 is mounted on the pad section 3 (see FIG. 3(E)). After the first substrate 7 and the second substrate 8 are combined, the lower face of the first substrate 7 serves as the outer face. After the first substrate 7 and the second substrate 8 are combined, the upper face of the first substrate 7 serves as the inner face.

Figure 3F:
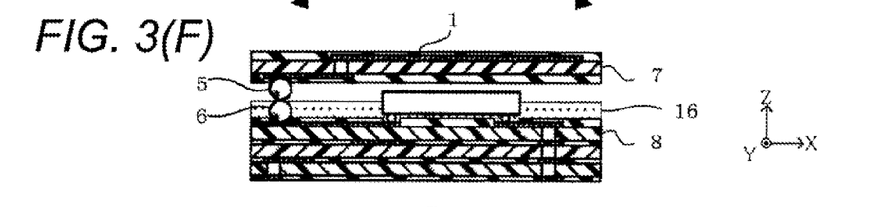

Next, the first substrate 7 is rotated 180°, thereby being turned over in the Z-axis direction (the vertical direction in FIG. 3(F)). Then, positional adjustment is made so that the center of the first ball 5 is aligned with the center of the second ball 6 in the vertical direction (the Z-direction) with respect to the surface of the substrate (the mounting surface of the substrate), and the first substrate 7 is laminated on the second substrate 8 (see FIG. 3(F)).

Figure 3G:
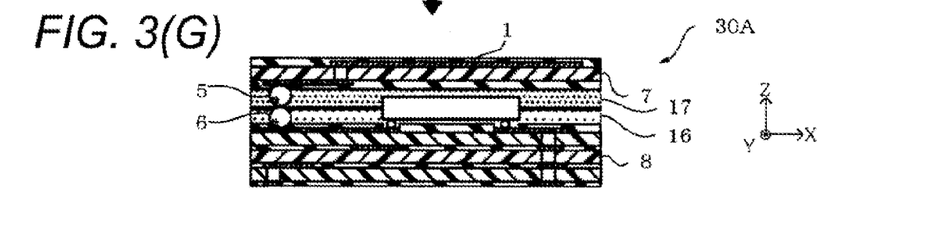

Then, on the side of the first substrate 7, the second molding resin 17 serving as the second layer is filled on the first molding resin 16 (in the positive direction of the Z-axis) (see FIG. 3(G)), thereby burying the remaining space (gap) between the second substrate 8 and the first substrate 7.

As described above, in the wireless module 30A, in the production processing thereof, the semiconductor chip 9 and the second ball 6 are mounted on the second substrate 8, and the first molding resin 16 is filled, for example, to a predetermined height lower than the height h of the second ball 6. In addition, the first ball 5 is mounted on the first substrate 7. Then, the second ball 6 on the second substrate 8 is made contact with the first ball 5 on the first substrate 7, thereby being connected electrically.

The first molding resin 16 is filled on the second substrate 8, and the contact faces of the first molding resin 16 and the second molding resin 17 on which they make contact with each other are substantially flat. Hence, in the case that the first ball 5 on the first substrate 7 is mounted on the first molding resin 16, the position of the first ball 5 is avoided from being displaced significantly. In other words, the first ball 5 can be superposed at the position of the second ball 6 serving as the desired position, whereby the first ball 5 and the second ball 6 can be connected together easily.

Furthermore, in this embodiment, as the first substrate 7 on which the antenna 1 is formed, a plurality of substrates each having an antenna being different from the antenna 1 in shape may be prepared and one of the substrates may be selected as the first substrate 7 according to the characteristics of the desired antenna and used to construct the wireless module 30A.

Moreover, the characteristics of the antenna 1 and the characteristics of the impedance of the wiring pattern 11 formed on the first substrate 7 are affected by the parameters (for example, a dielectric constant (∈) and a dielectric loss tangent (tan δ)) of the material of the second molding resin 17. Hence, the two layers of molding resin are used, and the material of the second molding resin 17 may be different from the material of the first molding resin 16. In this case, for example, the two layers of molding resin may be changed according to the type of the antenna 1 formed on the first substrate 7 or the desired characteristics of the antenna.

As a result, the characteristics of the antenna 1 and the characteristics of the impedance of the wiring pattern 11 formed on the first substrate 7 can be adjusted according to the timing of the production.

(Third Embodiment)

In the second embodiment, it is assumed that the first molding resin 16 is filled to the height h of the second ball 6 or to a height slightly lower than the height h of the second ball 6. In a third embodiment, a case is shown in which the first molding resin 16 is filled to a height exceeding the height h of the second ball 6.

In a wireless module according to the third embodiment, the same components as those according to the first and second embodiments are designated by the same reference numerals and signs, and their descriptions are omitted.

Figure 4:
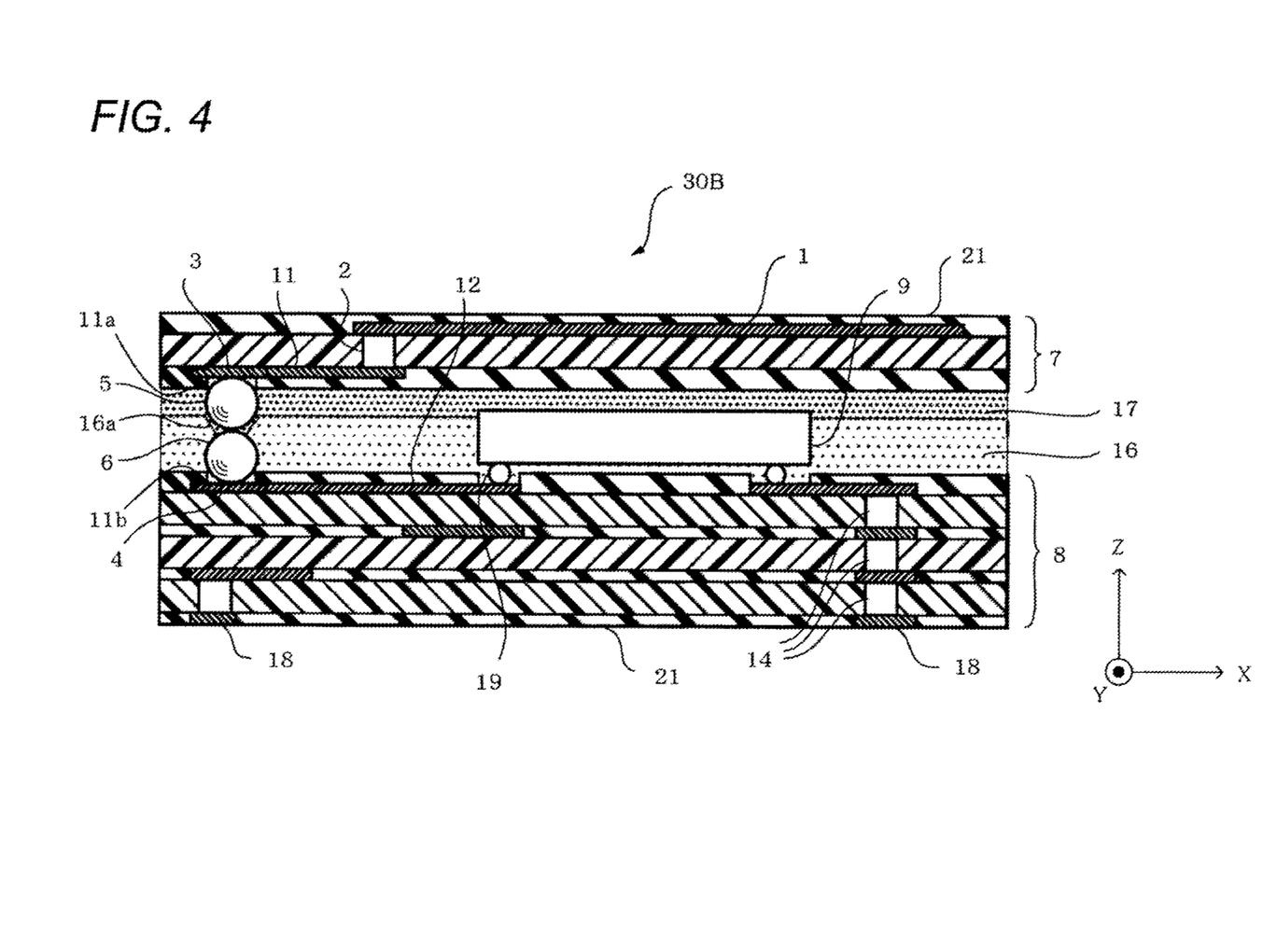
FIG. 4 is a cross-sectional view showing an example of a structure of a wireless module according to a third embodiment.

FIG. 4 is a cross-sectional view showing an example of a structure of a wireless module 30B according to the third embodiment. In the wireless module 30B, the first molding resin 16 is filled in the space from the inner face of the second substrate 8 to a height exceeding the height of the second ball 6. Furthermore, an opening 16a for allowing the second ball 6 to be exposed is formed in the first molding resin 16.

Figure 5A:
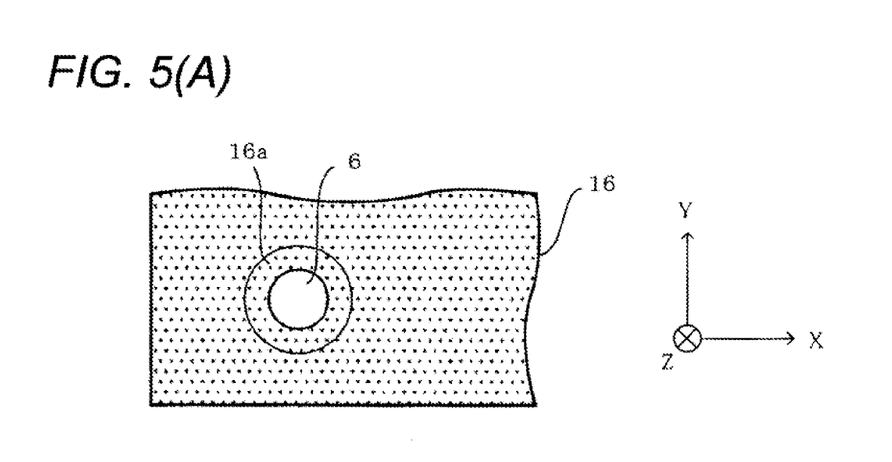
FIGS. 5(A) and 5(B) are views showing an opening in a first molding resin according to the third embodiment.
Figure 5B:
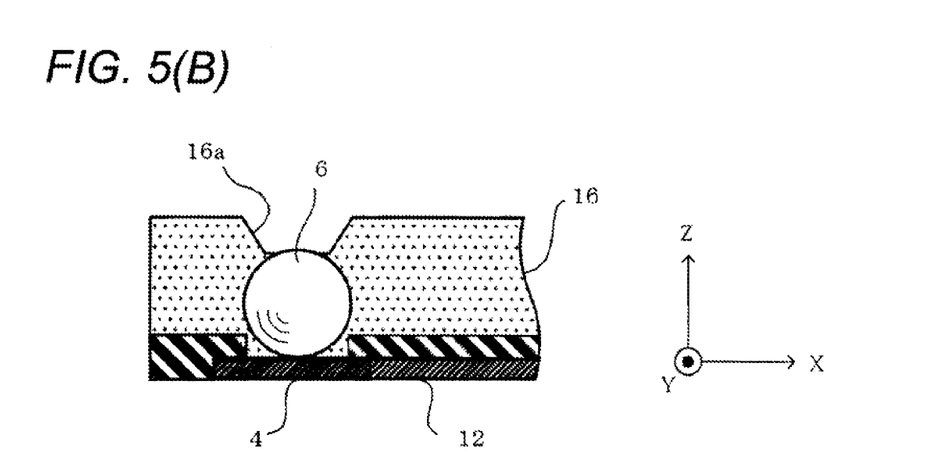

FIG. 5(A) is a view showing the opening 16a of the first molding resin 16 from above (in the Z-direction), and FIG. 5(B) is a fragmentary enlarged cross-sectional side view showing the area near the opening 16a of the first molding resin 16 in an enlarged manner.

In FIGS. 5(A) and 5(B), the opening 16a is formed into a shape such that the second ball 6 is exposed. For example, in FIG. 5(B), the opening 16a is formed so as to expand outward from the X-direction center of the opening 16a and formed into a mortar shape or a curved shape opposing the spherical face of the ball. In this case, when the first ball 5 is superposed on the second ball 6, the first ball 5 is guided by the shape of the opening 16a and is fitted into the opening 16a, thereby being positioned as desired.

The shape of the opening 16a is not limited to the above-mentioned shape but may be, for example, a cylindrical shape. In the case of the cylindrical shape, the inside diameter of the opening 16a on the plane (XY plane) along the mounting surface of the substrate is set to a size such that the first ball 5 can make contact with the second ball 6. Also in this case, the first ball 5 is fitted into the opening 16a, thereby being positioned.

In addition, the second molding resin 17 is filled to bury the space left after the first molding resin 16 was filled, that is, the remaining space (gap) between the second substrate 8 and the first substrate 7.

Next, processing for producing the wireless module 30B will be described.

FIG. 6 is a view showing the processing for producing the wireless module 30B.

Figure 6A:
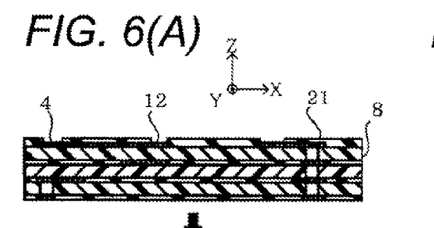
FIGS. 6(A) to 6(H) are views showing an example of processing for producing the wireless module according to the third embodiment.
Figure 6B:
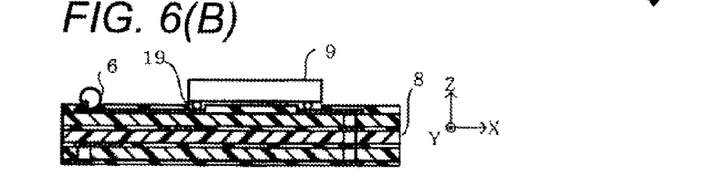
Figure 6C:
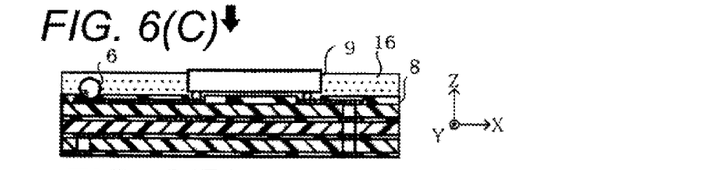

First, the wiring pattern 12 and the pad section 4 are formed on the upper face of the second substrate 8 (see FIG. 6(A)), and the semiconductor chip 9 is, for example, flip-chip mounted on the bumps 19 located on the wiring pattern 12 (see FIG. 6(B)).

Next, the second ball 6 is mounted on the wiring pattern 12. Then, the first molding resin 16 is filled to a height exceeding the height h of the second ball 6 (see FIG. 6(C)).

Figures 6D, 6F:
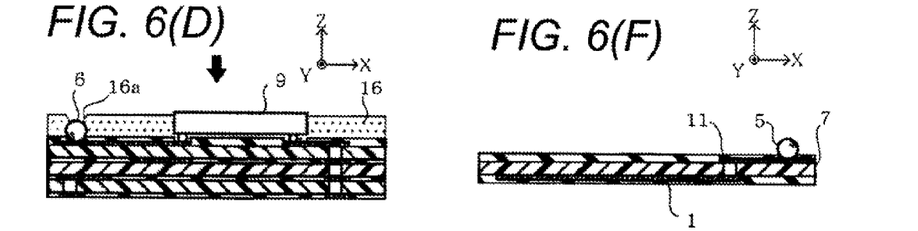

Next, the portion of the first molding resin 16 corresponding to the first ball 5 is removed to form the opening 16a (see FIG. 6(D)). As described above, the opening 16a is formed into a shape such that the second ball 6 is exposed, for example, a shape such that the opening 16a expands outward from the center of the opening 16a.

Figure 6E:
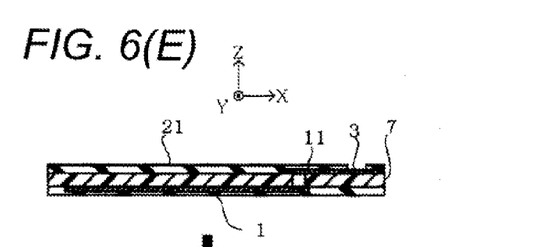

On the other hand, the antenna 1 is formed on the lower face of the first substrate 7, and the wiring pattern 11 and the pad section 3 are formed on the upper face of the first substrate 7 (see FIG. 6(E)). Furthermore, the first ball 5 is mounted on the pad section 3 (see FIG. 6(F)). After the first substrate 7 and the second substrate 8 are combined, the lower face of the first substrate 7 serves as the outer face. After the first substrate 7 and the second substrate 8 are combined, the upper face of the first substrate 7 serves as the inner face.

Figure 6G:
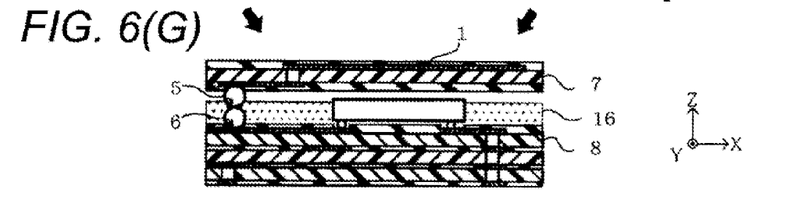

Next, the first substrate 7 is rotated 180°, whereby the first substrate 7 is turned over in the Z-direction (the vertical direction in FIG. 6(G)). Then, the first ball 5 is fitted into the opening 16a and adjusted in position, whereby the first ball 5 is made contact with the second ball 6, and the first substrate 7 is laminated on the second substrate 8 (see FIG. 6(G)).

Figure 6H:
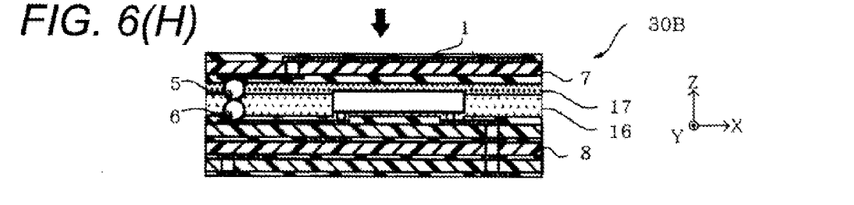

Then, the second molding resin 17 is filled on the first molding resin 16 (in the positive direction of the Z-axis), thereby burying the remaining space (gap) between the second substrate 8 and the first substrate 7 (see FIG. 6(H)). Hence, in the case that the sizes of the substrates and the balls of the wireless module according to this embodiment are the same as those according to the second embodiment, the first molding resin 16 becomes thicker and the second molding resin 17 becomes thinner in this embodiment.

In the wireless module 30B, in the production processing thereof, the semiconductor chip 9 and the second ball 6 are mounted on the second substrate 8, and the first molding resin 16 is filled to a predetermined height higher than the height h of the second ball 6. In addition, the portion of the first molding resin 16 located right above and opposing the second ball 6 is removed to form the opening 16a in the first molding resin 16. Furthermore, the first ball 5 is mounted on the first substrate 7. Then, the second ball 6 on the second substrate 8 is made contact with the first ball 5 on the first substrate 7, thereby being connected electrically.

The first molding resin 16 is filled on the second substrate 8, and the contact face of the first molding resin 16 to be made contact with the second molding resin 17 is substantially flat. Furthermore, the first ball 5 is disposed in the opening 16a of the first molding resin 16. Hence, in the case that the first ball 5 on the first substrate 7 is superposed on the second ball 6, the first ball 5 is not displaced significantly. In other words, the first ball 5 can be superposed at the position of the second ball 6 serving as the desired position, whereby the first ball 5 and the second ball 6 can be connected together easily.

Furthermore, in this embodiment, as in the second embodiment, as the first substrate 7 on which the antenna 1 is formed, a plurality of substrates each having an antenna being different from the antenna 1 in shape may be prepared and one of the substrates may be selected as the first substrate 7 according to the characteristics of the desired antenna and used to construct the wireless module 30A.

Moreover, the characteristics of the antenna 1 and the characteristics of the impedance of the wiring pattern 11 formed on the first substrate 7 are affected by the parameters (for example, a dielectric constant and a dielectric loss tangent) of the material of the second molding resin 17. Hence, the two layers of molding resin are used, the material of the second molding resin 17 may be different from the material of the first molding resin 16, and the two layers of the molding resin may be changed according to the type of the antenna 1 formed on the first substrate 7 or the desired characteristics of the antenna.

As a result, the characteristics of the antenna 1 and the characteristics of the impedance of the wiring pattern 11 formed on the first substrate 7 can be adjusted according to the timing of the production.

Next, modifications of the wireless modules according to the first to third embodiments will be described.

(First Modification)

Figure 7:
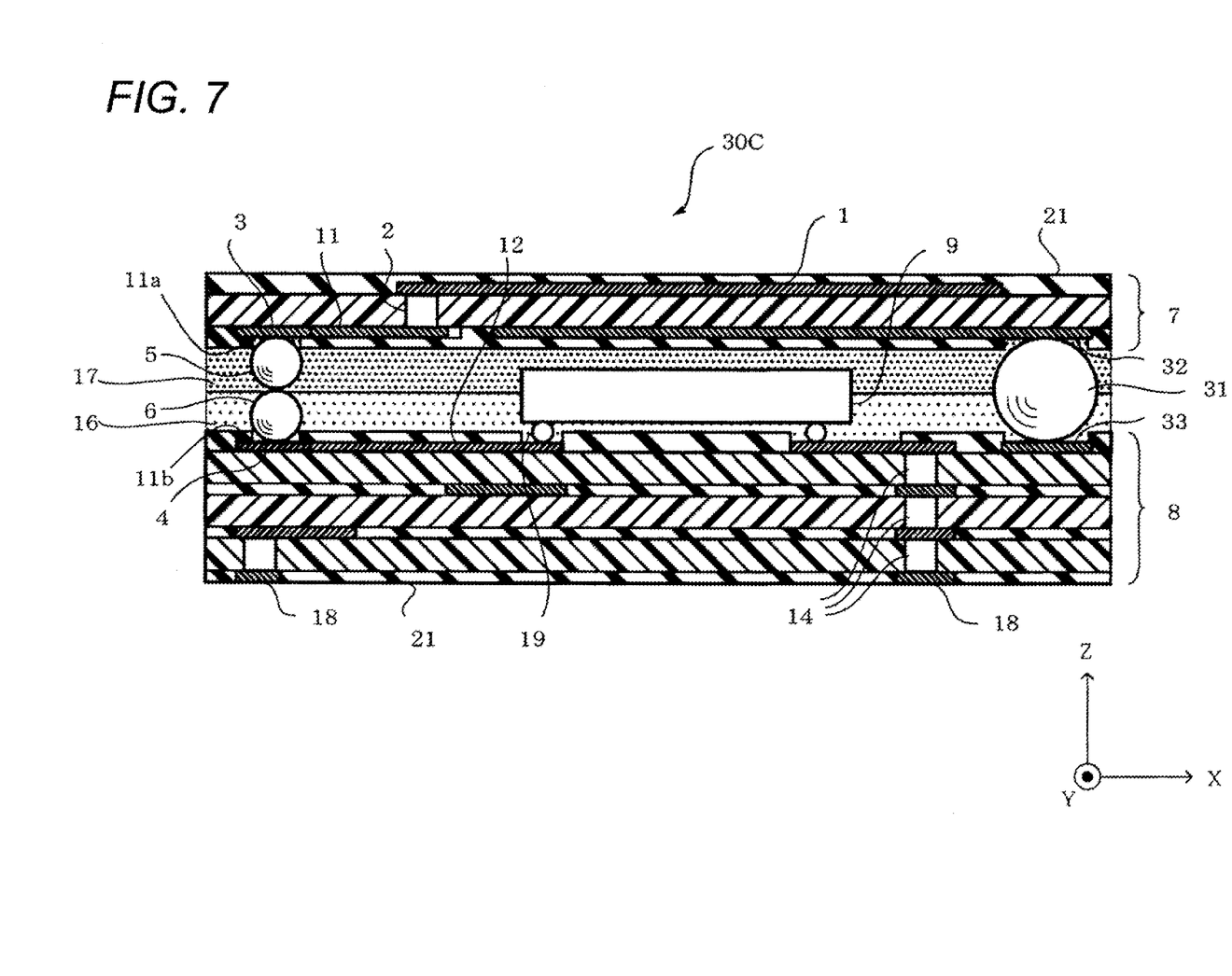
FIG. 7 is a cross-sectional view showing an example of a structure of a wireless module according to a first modification.

FIG. 7 is a cross-sectional view showing an example of a structure of a wireless module 30C according to a first modification. In the wireless module 30C, a third ball 31 larger than the first ball 5 and the second ball 6 in diameter are disposed between the first substrate 7 and the second substrate 8. In other words, the third ball 31 is disposed so as to make contact with the first substrate 7 and the second substrate 8. In addition, in the wireless module 30C, pad sections 32 and 33 for receiving the third ball 31 are formed on the first substrate 7 and the second substrate 8, respectively.

In the wireless module 30c, the first substrate 7 and the second substrate 8 may merely be positioned according to the center of the single large third ball 31. Hence, positional adjustment can be made easily without forming the above-mentioned opening 16a. Furthermore, although two layers of molding resin are shown as examples in FIG. 7, even in the case that the molding resin is not formed into two layers, positional adjustment can also be made easily. In the case that the opening 16a is formed, positional adjustment can be made more easily.

A ball having the same size as that of the third ball 31 may be connected to another pad section on the second substrate 8, and the number of the third balls 31 is arbitrary.

(Second Embodiment)

Figure 8:
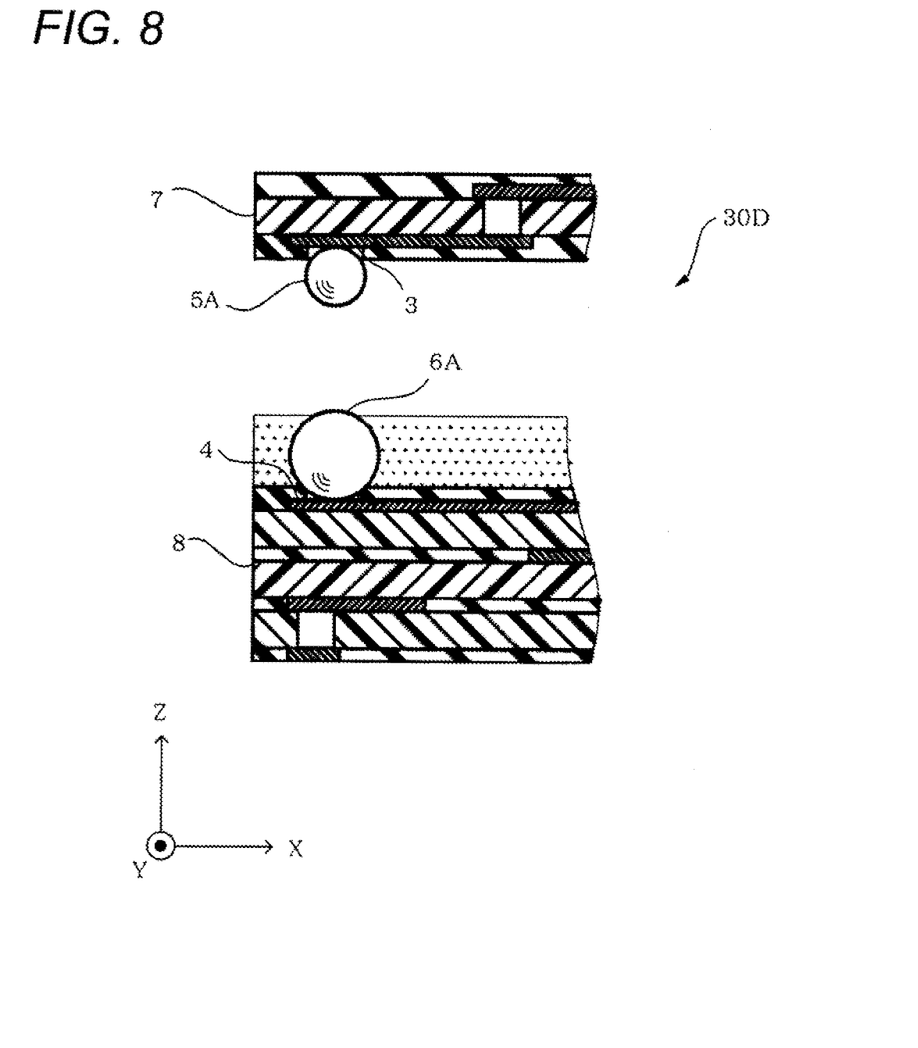
FIG. 8 is a view showing an example of a structure of a part of a wireless module according to a second modification.

FIG. 8 is a view showing an example of a structure of a part of a wireless module 30D according to a second modification. In the wireless module 30D, a case is shown in which the diameter of a second ball 6A to be connected to the pad section 4 of the second substrate 8 is larger than the diameter of a first ball 5A to be connected to the pad section 3 of the first substrate 7.

In the wireless module 30D, the second ball 6A is disposed on the upper face of the second substrate 8. Then, the first ball 5A is made contact with the second ball 6A, whereby the first substrate 7 is connected. Since the size of the second ball 6A is larger than that of the first ball 5A, the connectable areas between the first ball 5A and the second ball 6A become large, and a large allowance for disposing the first ball 5A is generated. As a result, the yield of mounting can be improved.

The present disclosure is not limited to the above-mentioned embodiments, but is applicable to any configurations, provided that the functions described in the claims or the functions of the configurations of the embodiments can be attained.

For example, although the electric conductors are spherical balls in the above-mentioned embodiments and modifications, the balls are not limited to spherical balls, but the balls may have various shapes (for example, a spindle shape, a cylindrical shape or a quadratic prism shape).

In addition, although the plurality of electric conductors are superposed in two stages in a direction orthogonal to the mounting surfaces of the substrates in the above-mentioned embodiments and modifications, the electric conductors may be superposed in three or more stages.

Furthermore, although the antenna 1 is mounted on the first substrate 7 and the semiconductor chip 9 is mounted on the second substrate 8 in the above-mentioned embodiments and modifications, the semiconductor chip 9, instead of the antenna, may be mounted on the first substrate 7. Even in this case, forming two layers of molding compound is effective, and strength is secured.

The present application is based on Japanese Patent Application No. 2013-014606 filed on Jan. 29, 2013, the contents of which are hereby incorporated by reference.

(Summary of Aspect of Present Disclosure)

A first wireless module of the present disclosure includes: a first substrate on which an antenna is mounted; a second substrate which opposes the first substrate and on which an electronic component is mounted; and a plurality of electric conductors which connect the first substrate and the second substrate and which transmit a signal between the antenna and the electronic component, wherein the plurality of electric conductors are disposed between the first substrate and the second substrate in series in a substantially vertical direction with respect to mounting surfaces of the first substrate and the second substrate.

A second wireless module of the present disclosure is a wireless module according to the first wireless module, wherein a molding compound is filled between the first substrate and the second substrate.

A third wireless module of the present disclosure is a wireless module according to the second wireless module, wherein the molding compound includes a first layer of molding compound filled on a second substrate side and a second layer of molding compound filled on a first substrate side, and wherein a length of the first layer of molding compound in a thickness direction thereof is equal to or lower than a length of the electric conductor mounted on the second substrate in a thickness direction thereof.

A fourth wireless module of the present disclosure is a wireless module according to the second wireless module, wherein the molding compound includes a first layer of molding compound filled on a second substrate side and a second layer of molding compound filled on a first substrate side, wherein a length of the first layer of molding compound in a thickness direction thereof is longer than a length of the electric conductor disposed inside the second substrate in a thickness direction thereof, and wherein an opening through which the electric conductor is exposed is formed in the first layer of molding compound.

A fifth wireless module of the present disclosure is a wireless module according to the third or fourth wireless module, wherein a material of the first layer of molding compound is different from a material of the second layer of molding compound.

A sixth wireless module of the present disclosure is a wireless module according to any one of the first to fifth wireless modules, wherein a material of the first substrate is different from a material of the second substrate.

A seventh wireless module of the present disclosure is a wireless module according to any one of the first to sixth wireless modules, wherein each of the plurality of electric conductors has conductivity and includes a core section and a solder layer enclosing the core section.

An eighth wireless module of the present disclosure is a wireless module according to the seventh wireless module, wherein diameters of the plurality of electric conductors are substantially the same.

A ninth wireless module of the present disclosure is a wireless module according to any one of the first to sixth wireless modules, wherein the plurality of electric conductors have conductivity, wherein a first electric conductor connected to the first substrate is an electric conductor having no core section, and wherein a second electric conductor connected to the second substrate is an electric conductor including the core section.

A tenth wireless module of the present disclosure is a wireless module according to the ninth wireless module, wherein a diameter of the first electric conductor is shorter than a diameter of the second electric conductor.

An eleventh wireless module of the present disclosure is a wireless module according to any one of the first to tenth wireless modules, wherein in addition to the plurality of electric conductors, a third electric conductor having a diameter longer than diameters of the plurality of electric conductors is disposed between the first substrate and the second substrate, and wherein the third electric conductor is disposed to contact the first substrate and the second substrate.

A twelfth wireless module of the present disclosure is a wireless module according to any one of the first to eleventh wireless modules, wherein the first substrate and the second substrate are partly covered with a resist, and wherein lands are exposed from the resist at pad sections to which the plurality of electric conductors disposed on the first substrate and the second substrate are connected.

A first production method for a wireless module of the present disclosure includes: a step of mounting an electronic component and a second electric conductor on a second substrate; a step of filling a first layer of molding compound from a second substrate side to have a predetermined height which allows the second electric conductor to be exposed; a step of mounting, on a first substrate provided with an antenna formed on one face thereof, a first electric conductor on the other face of the first substrate; a step of laminating the second substrate and the first substrate so as to connect the first electric conductor and the second electric conductor; and a step of filling a second layer of molding compound between the first substrate and the second substrate and in a region other than a region in which the first layer of molding compound has been filled.

A second production method for a wireless module of the present disclosure includes: a step of mounting an electronic component and a second electric conductor on a second substrate; a step of filling a first layer of molding compound from a second substrate side to have a predetermined height higher than the height of the second electric conductor; a step of forming an opening which guides the second electric conductor at a position of the first layer of molding compound opposing the second electric conductor; a step of mounting, on a first substrate provided with an antenna formed on one face thereof, a first electric conductor on the other face of the first substrate; a step of laminating the second substrate and the first substrate so as to connect the first electric conductor and the second electric conductor at the opening; and a step of filling a second layer of molding compound between the first substrate and the second substrate in a region other than a region in which the first layer of molding compound has been filled.

INDUSTRIAL APPLICABILITY

The present disclosure is useful for a wireless module whose size can be made smaller and for a production method for a wireless module, for example.

DESCRIPTION OF REFERENCE SIGNS 1 antenna
2, 14 via hole
3, 4, 32, 33 pad section
5, 5A first ball
6, 6A second ball
7 first substrate
8 second substrate
9 semiconductor chip
10 molding resin
11, 12 wiring pattern
11a, 11b land
16 first molding resin
16a opening
17 second molding resin
18 connection pad
19 bump
21 resist
30, 30A, 30B, 30C, 30D wireless module
31 third ball

What is claimed is:

1. A wireless module comprising:
a first substrate on which an antenna is mounted;
a second substrate which opposes the first substrate and on which an electronic component is mounted; and
a plurality of electric conductors which connect the first substrate and the second substrate and which transmit a signal between the antenna and the electronic component,
wherein the plurality of electric conductors are disposed between the first substrate and the second substrate in series in a vertical direction with respect to mounting surfaces of the first substrate and the second substrate,
wherein in addition to the plurality of electric conductors, a third electric conductor having a diameter longer than diameters of the plurality of electric conductors is disposed between the first substrate and the second substrate, and
wherein the third electric conductor is disposed to contact the first substrate and the second substrate.

2. The wireless module according to claim 1,
wherein a molding compound is filled between the first substrate and the second substrate.

3. The wireless module according to claim 2,
wherein the molding compound comprises a first layer of molding compound filled on a second substrate side and a second layer of molding compound filled on a first substrate side, and
wherein a length of the first layer of molding compound in a thickness direction thereof is equal to or lower than a length of the electric conductor mounted on the second substrate in a thickness direction thereof.

4. The wireless module according to claim 2,
wherein the molding compound comprises a first layer of molding compound filled on a second substrate side and a second layer of molding compound filled on a first substrate side,
wherein a length of the first layer of molding compound in a thickness direction thereof is longer than a length of the electric conductor disposed inside the second substrate in a thickness direction thereof, and
wherein an opening through which the electric conductor is exposed is formed in the first layer of molding compound.

5. The wireless module according to claim 3,
wherein a material of the first layer of molding compound is different from a material of the second layer of molding compound.

6. The wireless module according to claim 1,
wherein a material of the first substrate is different from a material of the second substrate.

7. The wireless module according to claim 1,
wherein each of the plurality of electric conductors has conductivity and comprises a core section and a solder layer enclosing the core section.

8. The wireless module according to claim 7,
wherein diameters of the plurality of electric conductors are the same.

9. A wireless module, comprising:
a first substrate on which an antenna is mounted;
a second substrate which opposes the first substrate and on which an electronic component is mounted; and
a plurality of electric conductors which connect the first substrate and the second substrate and which transmit a signal between the antenna and the electronic component,
wherein the plurality of electric conductors are disposed between the first substrate and the second substrate in series in a vertical direction with respect to mounting surfaces of the first substrate and the second substrate,
wherein the plurality of electric conductors have conductivity,
wherein a first electric conductor connected to the first substrate is an electric conductor having no material difference between a core section and a surrounding shell,
wherein a second electric conductor connected to the second substrate is an electric conductor having a material difference between a core section and a surrounding shell, and
wherein a diameter of the first electric conductor is shorter than a diameter of the second electric conductor.

10. The wireless module according to claim 1,
wherein the first substrate and the second substrate are partly covered with a resist, and
wherein lands are exposed from the resist at pad sections to which the plurality of electric conductors disposed on the first substrate and the second substrate are connected.

* * * * *